(12) United States Patent
Kim

(10) Patent No.: US 8,883,521 B2
(45) Date of Patent: Nov. 11, 2014

(54) CONTROL METHOD OF MULTI-CHIP PACKAGE MEMORY DEVICE

(71) Applicant: SK Hynix Inc., Icheon-si (KR)

(72) Inventor: Bo Kyeom Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 38 days.

(21) Appl. No.: 13/711,102

(22) Filed: Dec. 11, 2012

(65) Prior Publication Data

US 2014/0011300 A1 Jan. 9, 2014

(30) Foreign Application Priority Data

Jul. 5, 2012 (KR) .................. 10-2012-0073410

(51) Int. Cl.
*H01L 21/00* (2006.01)
*H01L 21/66* (2006.01)
*G11C 29/00* (2006.01)

(52) U.S. Cl.
CPC .............. *H01L 22/22* (2013.01); *G11C 29/785* (2013.01); *G11C 29/82* (2013.01)
USPC ...... 438/4; 438/14; 438/17; 438/18; 438/130; 257/E21.521

(58) Field of Classification Search
CPC ................. H01L 2924/00; H01L 2224/49175; H01L 2224/48091; H01L 2224/48227; H01L 2924/00014; H01L 2224/48137; H01L 22/22; G11C 2029/0409; G11C 17/18; G11C 2029/5006; G11C 29/02; G11C 29/022; G11C 29/1201; G11C 29/785
USPC ............ 438/4, 14, 17, 18, 130; 257/E21.521
See application file for complete search history.

(56) References Cited

U.S. PATENT DOCUMENTS

2012/0200329 A1\* 8/2012 Shim et al. .................... 327/158

FOREIGN PATENT DOCUMENTS

| KR | 1020030052659 A | 6/2003 |
| KR | 1020100040288 A | 4/2010 |

\* cited by examiner

*Primary Examiner* — Michelle Mandala
(74) *Attorney, Agent, or Firm* — William Park & Associates Patent Ltd.

(57) ABSTRACT

A control method of a multi-chip package memory device includes the steps of applying stack signals to stack pads of memory dies, applying a repair signal to repair pads of the respective memory dies, setting one or more repaired memory dies for replacing a failed memory die among the memory dies, based on the repair signal applied to the respective memory dies, and setting stack states indicating a logical access order of the other memory dies excluding the repaired memory die, based on the stack signals applied to the other memory dies.

18 Claims, 8 Drawing Sheets

FIG.2

| Die # | ST INFO | ST<0> | ST<1> | RP | ST State |
|---|---|---|---|---|---|
| 100 | – | GND | GND | GND | Die 0 |
| 200 | – | Vcc | GND | GND | Die 1 |
| 300 | – | GND | GND | Vcc | For repair |

FIG.3

| Die # | ST INFO | ST<0> | ST<1> | RP | Changed ST State |
|---|---|---|---|---|---|
| 100 | – | GND | GND | GND | Die 0 |
| 200 | Fail | Vcc | GND | GND | Fail |
| 300 | Die 1 | GND | GND | GND | Die 1 (repaired) |

CONTROL METHOD OF MULTI-CHIP PACKAGE MEMORY DEVICE

CROSS-REFERENCES TO RELATED APPLICATION

The present application claims priority under 35 U.S.C. §119(a) to Korean application number 10-2012-0073410, filed on Jul. 5, 2012, in the Korean Intellectual Property Office, which is incorporated herein by reference in its entirety.

BACKGROUND

1. Technical Field

The present invention relates generally to a semiconductor device, and more particularly, to a control method of a multi-chip package memory device including a plurality of dies.

2. Related Art

The computing environment has developed rapidly in which computer systems are used anytime and anywhere. Usage of portable electronic devices such as mobile phones, digital cameras, and notebook computers has rapidly increased. Since such portable electronic devices utilize data storage devices formed using main or secondary memory devices, much importance is placed on memory devices.

The data storage device using memory devices does not include a mechanical driver, which leads to excellent stability and durability, high information access speed, and small power consumption. The data storage device having such advantages may include a USB (Universal Serial Bus) memory device, a memory card having various interfaces, an SSD (solid state drive) and the like.

As more portable electronic devices handle large files such as music and video files, the data storage device is required to have a large storage capacity, which may be achieved by incorporating a plurality of memory devices. Each memory device may include a plurality of memory chips (or dies) to increase the storage capacity, and maybe packaged so as to seem like one memory device even though several chips (or dies) are stacked therein.

SUMMARY

A control method of a multi-chip package memory device capable of replacing a failed memory chip is described herein.

In an embodiment of the present invention, a control method of a multi-chip package memory device includes the steps of: applying stack signals to stack pads of memory dies; applying a repair signal to repair pads of the respective memory dies; setting one or more repaired memory dies for replacing a failed memory die among the memory dies, based on the repair signal applied to the respective memory dies; and setting stack states indicating a logical access order of the other non-failed memory dies, based on the stack signals applied to the other non-failed memory dies.

The control method may further include the step of, when a failure occurs among the memory dies, replacing the failed memory die with the repaired memory die.

The step of replacing the failed memory die may include the steps of: providing a first control command for storing first stack information, and an address of a stack information area in which the first stack information is to be stored, to the failed memory die; storing the first stack information indicating a failure in the stack information area of the failed memory die; providing a second control command for storing second stack information, and an address of the stack information area in which the second stack information is to be stored, to the repaired memory die to replace the failed memory die; and storing the second stack information indicating the stack state of the failed memory die into the stack information area of the repaired memory die.

BRIEF DESCRIPTION OF THE DRAWINGS

Features, aspects, and embodiments are described in conjunction with the attached drawings, in which:

FIG. 2 is a table indicating the initial states of the memory chips included in the multi-chip package memory device according to an embodiment of the present invention;

FIG. 3 is a table indicating a state in which a failed memory chip having a defect among the memory chips included in the multi-chip package memory device according to an embodiment of the present invention is replaced;

DETAILED DESCRIPTION

Hereinafter, a method for controlling a multi-chip package memory device according to the present invention will be described below with reference to the accompanying drawings through various embodiments.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in the sentence. Furthermore, 'include/comprise' or 'including/comprising' used in the specification represents that one or more components, steps, operations, and elements exists or are added.

Figure 1:
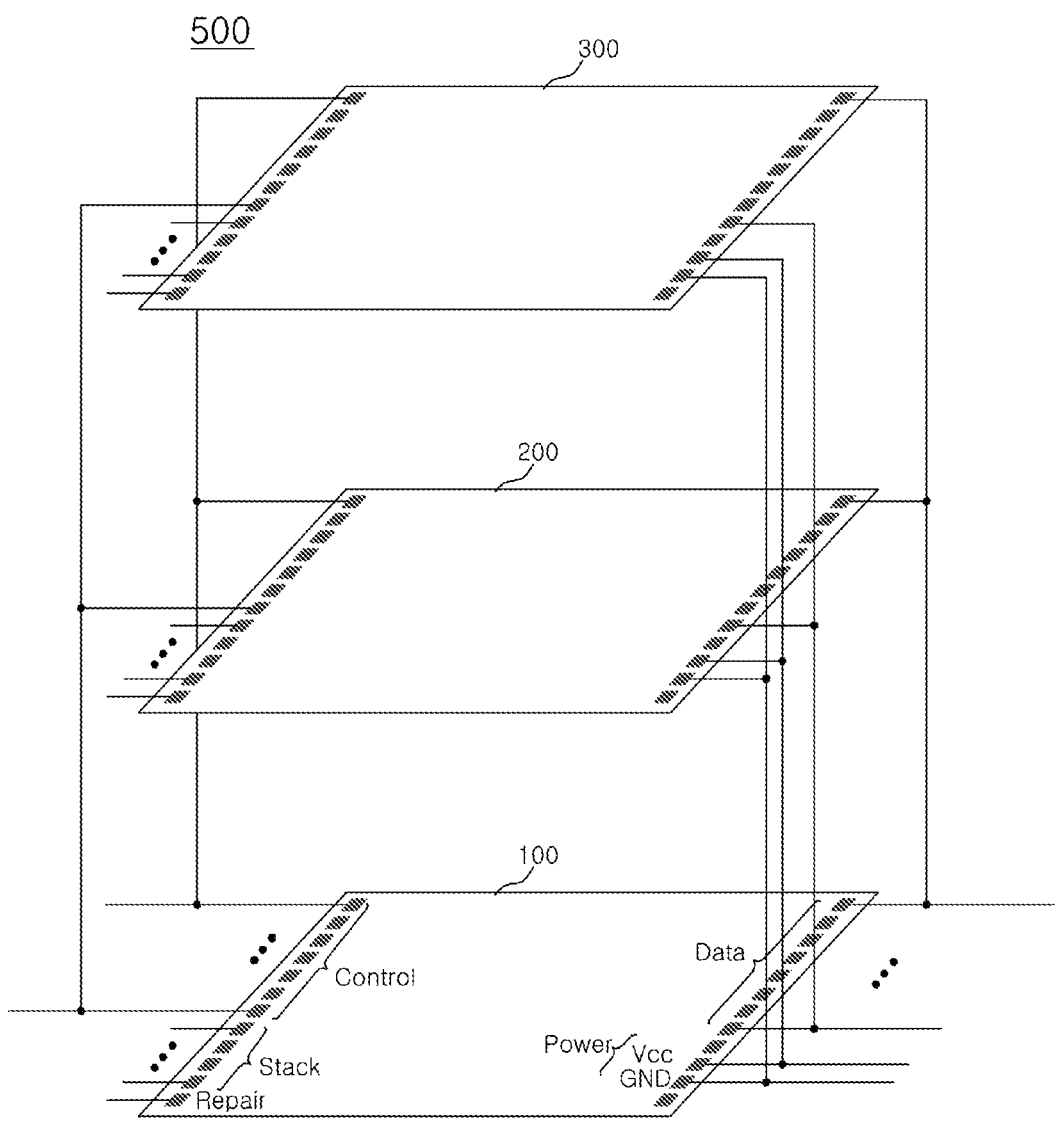
FIG. 1 is a perspective view of memory chips included in a multi-chip package memory device according to an embodiment of the present invention.

FIG. 1 is a perspective view of memory chips included in a multi-chip package memory device according to an embodiment of the present invention. Referring to FIG. 1, the multi-chip package memory device 500 includes a plurality of memory chips 100, 200, and 300. Hereafter, the memory chips 100, 200, and 300 will be referred to as memory dies. For convenience of description, FIG. 1 illustrates the multi-chip package memory device 500 including three memory dies 100, 200, and 300. However, the number of memory dies included in the multi-chip package memory device 500 may differ depending on the storage capacity of the multi-chip package memory device 500.

According to an embodiment of the present invention, the multi-chip package memory device 500 includes one or more repaired memory dies 300. The repaired memory dies 300 are used to replace memory dies 100 and 200 should a defect occur. Therefore, the repaired memory die 300 may receive control signals such as a specific command or a repair signal, that are different from signals received by the memory dies 100 and 200. This will be described below in detail.

The memory dies 100, 200, and 300 each include a plurality of pads. Except for stack pads that apply a stack signal and repair pads that apply a repair signal, all other pads such as control signal pads, data pads, and power supply pads are connected to like pads across the memory dies 100, 200, and 300 (i.e. control signal pads of memory die 100 is connected to control signal pads of memory die 200, which are also connected to control signal pads of memory die 300).

This suggests that the multi-chip package memory device 500 is a 1-CE (or 1-CS) multi-chip package memory device enabled by one chip enable (CE) signal or chip selection (CS) signal provided from an external device, such as a memory controller, host device or the like. The access to the memory dies 100 and 200 included in the 1-CE (or 1-CS) multi-chip package memory device 500 may be controlled by an address. When the repaired memory die 300 replaces the failed memory dies 100 or 200, the repaired memory die 300 may receive the address instead of the failed memory dies 100 or 200.

The control signal provided to the memory dies 100, 200, and 300 indicates a signal for controlling the operation of the memory dies 100, 200, and 300, like a command and address. For example, the control signal may be provided through control signal pads. As another example, the control signal may be provided through data pads according to an input/output multiplexing method. The control signal may be provided through the data pads, and whether the signal provided through the data pads is a command, address, or data may be determined according to a control signal provided through the control signal pads.

Whether the memory dies 100, 200, and 300 of the 1-CE (or 1-CS) multi-chip package memory device 500 are repaired memory dies or not is decided according to a repair signal applied through the repair pads. Furthermore, the stack states of the memory dies 100 and 200 of the 1-CE (or 1-CS) multi-chip package memory device 500 are decided according to the stack signal applied through the stack pads. This means that an address for accessing the memory dies 100 and 200 is decided according to the stack signal. The method for deciding the stack states of the memory dies 100, 200, and 300 and a repaired memory die will be described in detail with reference to FIG. 2.

FIG. 2 is a table indicating the initial states of the memory chips included in the multi-chip package memory device according to an embodiment of the present invention. FIG. 2 shows stack signals applied to stack pads ST<0> and ST<1> and repair signals applied to repair pads of the memory dies 100 and 200 and the repaired memory die 300. FIG. 2 shows the stack states of the memory dies and whether the memory dies are repair dies or not, based on the control signals.

In FIG. 2, the control signals applied to the stack pads ST<0> and ST<1> and the repair pad RP are only an example, and may differently set through combinations of the power supply voltage Vcc and the ground voltage GND, if necessary.

Hereafter, the stack states of the memory dies are defined in a logic access order. For example, suppose that memory dies having a lower stack state and an upper stack state are decided according to the stack states. The address of a memory die having a lower stack state and the address of a memory die having an upper stack state may be consecutively set. Thus, the address of the memory die having a lower stack state may have a higher order than the address of the memory die having an upper stack state.

The stack pads ST<0> and ST<1> of the memory die 100 receive the ground voltage GND, and the repair pad RP of the memory die 100 also receives the ground voltage GND. In this case, the memory die 100 has a first stack state. That is, the memory die 100 is assigned as a first memory die Die 0.

The stack pad ST<0> of the memory die 200 receives the power supply voltage Vcc, the stack pad ST<1> of the memory die 200 receives the ground voltage GND, and the repair pad RP of the memory die 200 also receives the ground voltage GND. In this case, the memory die 200 has a second stack state. That is, the memory die 200 is assigned as a second memory die Die 1.

The stack pads ST<0> and ST<1> of the memory die 300 receive the ground voltage GND, and the repair pad RP of the memory die 300 receives the power supply voltage Vcc. In this case, the memory die 300 is decided as a repaired memory die.

The stack information ST INFO is stored in specific areas of the memory dies 100, 200, and 300, for example, in hidden areas which are not provided to users, and may include information indicating the stack states of the memory dies 100, 200, and 300. The stack information ST INFO has a higher priority than the stack signals applied to the stack pads ST<0> and ST<1> of the memory dies 100, 200, and 300 and the repair signal applied to the repair pads RP. When there is no stack information ST INFO, the stack states of the memory dies 100, 200, and 300 are decided according to the stack signals applied to the stack pads ST<0> and ST<1> and the repair signals applied to the repair pads RP.

Based on the stack information ST INFO, the stack signals, and the repair signals of FIG. 2, the memory dies 100, 200, and 300 are assigned their stack states, and perform corresponding operations. For example, the memory die 100 checks the stack information ST INFO before checking the control signals applied to the stack pads ST<0> and ST<1> and the repair pad RP. Since the stack information ST INFO is not stored, the memory die 100 may recognize itself as the first memory die Die 0 based on the control signals applied to the stack pads ST<0> and ST<1> and the repair pad RP, and perform the corresponding operation. The memory die 200 checks the stack information ST INFO before checking the control signals applied to the stack pads ST<0> and ST<1> and the repair pad RP. Since the stack information ST INFO is not stored, the memory die 200 may recognize itself as the second memory die Die 1 based on the control signals applied to the stack pads ST<0> and ST<1> and the repair pad RP, and perform the corresponding operation. The memory die 300 checks the stack information ST INFO before checking the control signals applied to the stack pads ST<0> and ST<1> and the repair pad RP. Since the stack information ST INFO is not stored, the memory die 300 may recognize itself as the repaired memory die based on the control signals applied to the stack pads ST<0> and ST<1> and the repair pad RP. Although control signals and data are provided, the memory die 300 may not operate until the memory die 300 replaces a failed memory die.

FIG. 3 is a table indicating a state in which a failed memory chip having a defect among the memory chips included in the multi-chip package memory device according to an embodiment of the present invention is replaced. During the operation of the multi-chip package memory device 500 of FIG. 1, the memory die 100 or 200 may not normally operate. In FIG. 3, suppose that the memory die 200 has a defect occurring therein, for convenience of description. In this case, the failed memory die 200 having a defect may be replaced with the repaired memory die 300 according to an embodiment of present invention. That is, the repaired memory die 300 takes the place of the failed memory die 200 and receives a command and address according to the stack state of the failed memory die 200, and performs the corresponding operation.

In order to replace the failed memory die 200 with the repaired memory die 300, a series of processes may be performed. The processes may include a process of inhibiting the failed memory die 200 from being operated, and a process of replacing the failed memory die 200 and enabling the repaired memory die 300 to operate. The processes will be described in more detail as follows.

In order to inhibit the failed memory die 200 from being operated, the stack information ST INFO is stored in, for example, the hidden area of the stack information area of the failed memory die 200. For this operation, a fail die control command and an address for accessing the stack information area are provided to the failed memory die 200, and when the failed information is stored as the stack information ST INFO, the failed memory die 200 ceases to operate, even if control signals and data are provided.

In order to replace the failed memory die 200 with the repaired memory die 300, the stack information ST INFO is stored, for example, in the hidden area of the stack information area of the repair memory die 300. For this operation, a repair die control command and an address for accessing the stack information area are provided to the repaired memory die 300, and when information indicating the stack state of the failed memory die 200 (the second memory die Die 1) is stored as the stack information ST INFO, the repaired memory die 300 begins operating as the second memory die Die 1 according to the provided control signals and data.

The power supply voltage Vcc for causing the repaired memory die 300 to be recognized as a repaired memory die is applied to the repair pad RP of the repaired memory die 300. However, in order for the repaired memory die 300 to actually replace the failed memory die 200, the ground voltage GND must be applied to the repair pad RP of the repaired memory die 300 in the same manner as it was applied to the memory die 200. In other words, the repair signal applied to the repair pad PR of the repair memory die 300 must be changed, from Vcc to GND. Since the signal applied to the repair pad RP cannot be physically changed, a circuit for changing the repair signal applied to the repair pad RP is required. Such a circuit is defined as a repair pad control unit, and will be described with reference to FIG. 4.

Figure 4:
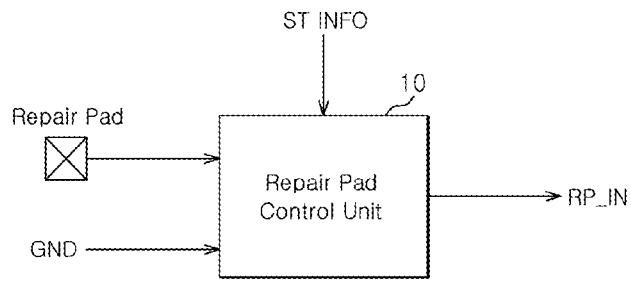
FIG. 4 is a block diagram of the repair pad control unit of the repaired memory chip included in the multi-chip memory device according to an embodiment of the present invention.

FIG. 4 is a block diagram of the repair pad control unit of the repaired memory chip included in the multi-chip memory device according to an embodiment of the present invention. The repair pad control unit 10 is connected between the repair pad RP and a repair signal input terminal RP_IN. The repair pad control unit 10 may be included in all of the memory dies 100, 200, and 300 of the multi-chip memory device 500 of FIG. 1.

The repair pad control unit 10 is configured to output the ground voltage GND or the repair signal provided through the repair pad RP to the repair signal input terminal RP_IN according to the stack information ST INFO. For example, when the stack information ST INFO is not activated, the repair pad control unit 10 outputs the power supply voltage Vcc, which was applied to the repair pad of the repaired memory die 300, provided through the repair pad RP to the repair signal input terminal RP_IN. As another example, the repair pad control unit 10 outputs the ground voltage GND to the repair signal input terminal RP_IN when the stack information ST INFO is activated, such as when information on the stack state for replacing the fail memory die 200 is stored in a specific area.

Figure 5:
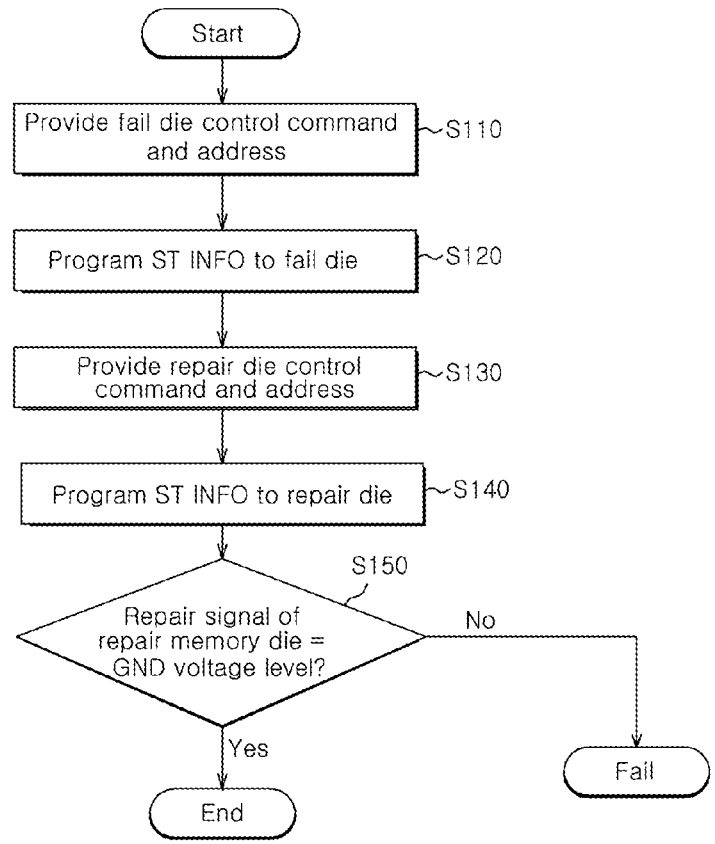
FIG. 5 is a flow chart indicating a control method of the multi-chip package memory device according to an embodiment of the present invention.

FIG. 5 is a flow chart indicating a control method of the multi-chip package memory device according to an embodiment of the present invention.

At step S110, a fail die control command and an address for accessing a specific area to store stack information are provided to a failed memory die. At step S120, failure information is stored as stack information in the specific area of the failed memory die, that is, in a hidden area for storing the stack information. Through steps S110 and S120, the fail memory die is controlled to cease operation.

At step S130, a repair die control command and an address for accessing a specific area to store stack information are provided to the repaired memory die for replacing the failed memory die. At step S140, the stack state of the failed memory die is stored as the stack information in the specific area of the repaired memory die, that is, in a hidden area for storing the stack information.

At step S150, the repaired memory die storing the stack information therein determines whether the repair signal is a ground voltage level or not. For example, as described above with reference to FIG. 4, the repaired memory die determines whether the repair signal provided through the repair pad control unit 10 is a ground voltage level or not. When the repair signal corresponds to levels other than the ground voltage level, the repaired memory die cannot replace the failed memory die. When the repair signal corresponds to the ground voltage level, the repaired memory die is controlled to replace the failed memory die through steps S130, S140, and S150.

Figure 6:
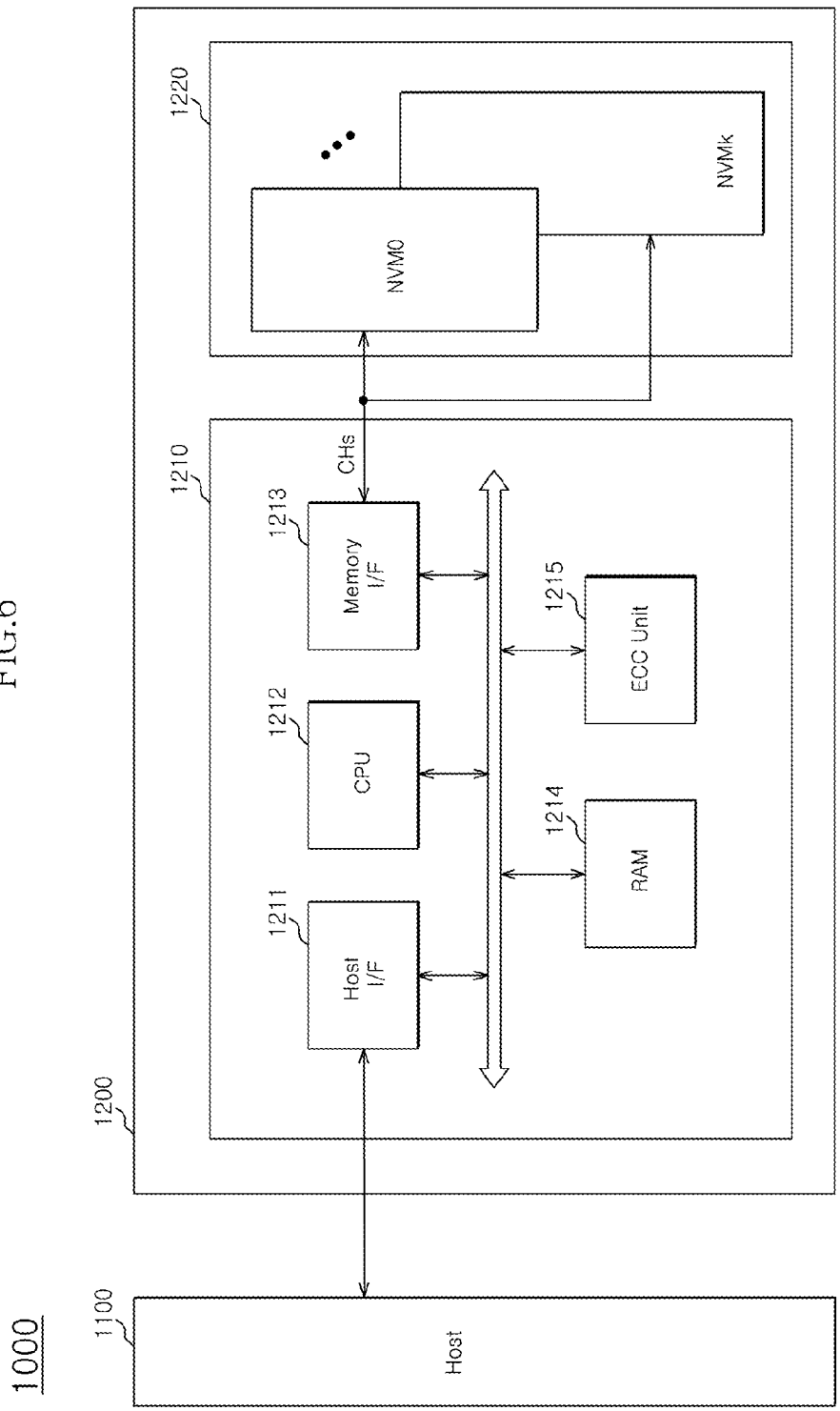
FIG. 6 is a block diagram illustrating a data processing system including the multi-chip package memory device according an the embodiment of the present invention.

FIG. 6 is a block diagram illustrating a data processing system including the multi-chip package memory device according to an embodiment of the present invention. Referring to FIG. 6, the data processing system 1000 includes a host device 1100 and a data storage device 1200. The data storage device 1200 includes a controller 1210 and a data storage medium 1220. The data storage device 1200 may be connected to the host device 1100 such as a desktop computer, a notebook computer, a digital camera, a mobile phone, an MP3 player, or a game machine. The data storage device 1200 may also be called a memory system.

The controller 1210 is connected to the host device 1100 and the data storage medium 1220. The controller 1210 is configured to access the data storage medium 1220 in response to a request from the host device 1100. For example, the controller 1210 may be configured to control a read, program, or erase operations of the data storage medium 1220. The controller 1210 is configured to drive firmware for controlling the data storage medium 1220.

The controller 1210 may include well-known components such as a host interface 1211, a CPU 1212, a memory interface 1213, a RAM 1214, and an ECC unit 1215.

The CPU 1212 is configured to control overall operations of the controller 1210 in response to a request from the host device 1100. The RAM 1214 may be used as a working memory of the CPU 1212, and may temporarily store data read from the data storage medium 1220 or data provided from the host device 1100.

The host interface 1211 is configured to interface the host device 1100 and the controller 1210, and may be configured to communicate with the host device 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 is configured to interface the controller 1210 and the data storage medium 1220 by providing a command and an address to the data storage medium 1220 and exchanging data with the data storage medium 1220.

The data storage medium 1220 may include a plurality of nonvolatile memory devices NVM0 to NVMk. Each of the nonvolatile memory devices NVM0 to NVMk may include the multi-chip package memory device 500 of FIG. 1 according to an embodiment of the present invention. As each of the nonvolatile memory devices NVM0 to NVMk may include the multi-chip package memory device 500 according to an embodiment of the present invention, the defect occurrence rate of the data storage device 1200 may be reduced.

The ECC unit 1215 is configured to detect an error of the data read from the data storage medium 1220 and to correct the detected error, when the detected error falls within a correction range. The ECC unit 1215 may be provided inside or outside the controller 1210 depending on the memory system 1000.

The controller 1210 and the data storage medium 1220 may be configured as a solid state drive (SSD).

As another example, the controller 1210 and the data storage medium 1220 may be integrated into one semiconductor device to form a memory card, particularly, a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted as various types of packages, particularly package on package (POP), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 7:
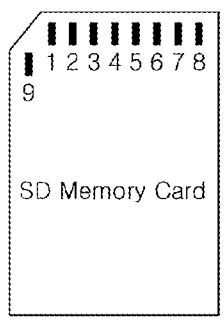
FIG. 7 illustrates a memory card including the multi-chip package memory device according to an embodiment of the present invention.

FIG. 7 illustrates a memory card including the multi-chip package memory device according to an embodiment of the present invention. FIG. 7 illustrates the exterior of an SD (secure digital) card among memory cards.

Referring to FIG. 7, the SD card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transferred. In general, the command is transmitted to the SD card from the host device, and the response signal is transmitted to the host device from the SD card.

The data pins (first, seventh, eighth, and ninth pins) are divided into receive (Rx) pins for receiving data transmitted from the host device and transmit (Tx) pins for transmitting data to the host device. The Rx pins and the Tx pins, respectively, form a pair to transmit differential signals.

The SD card may include the multi-chip package memory device according to an embodiment of the present invention and a controller for controlling the memory device. The controller included in the SD card may have the same configuration and function as the controller 1210 illustrated in FIG. 6.

Figure 8:
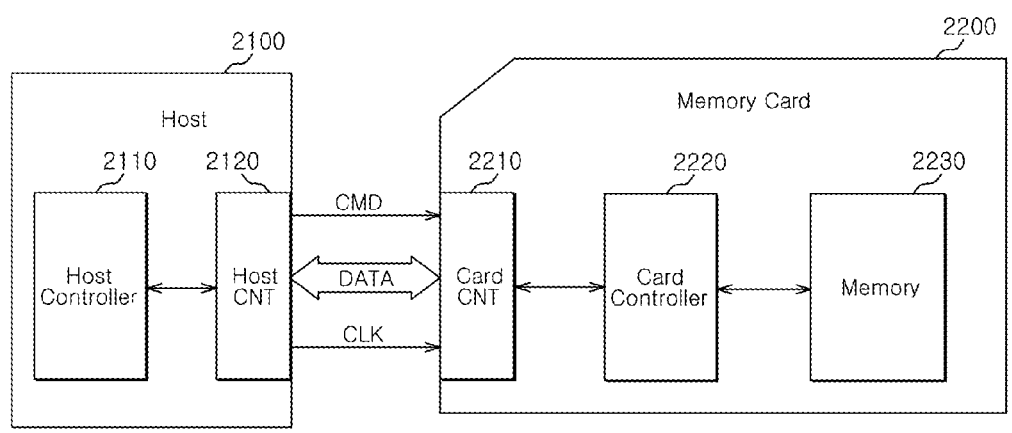
FIG. 8 is a block diagram illustrating the internal configuration of the memory card illustrated in FIG. 7 and the connection relation between the memory card and a host device.

FIG. 8 is a block diagram illustrating the internal configuration of the memory card illustrated in FIG. 7 and the connection relation between the memory card and a host device. Referring to FIG. 8, the data processing system 2000 includes a host device 2100 and a memory card 2200. The host device 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may differ depending on the type of the memory card 2200.

The host device 2100 stores data in the memory card 2200 or reads data stored in the memory card 2200.

The host controller 2110 transmits a write command CMD, a clock signal CLK generated from a clock generator (not illustrated) inside the host device 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 9:
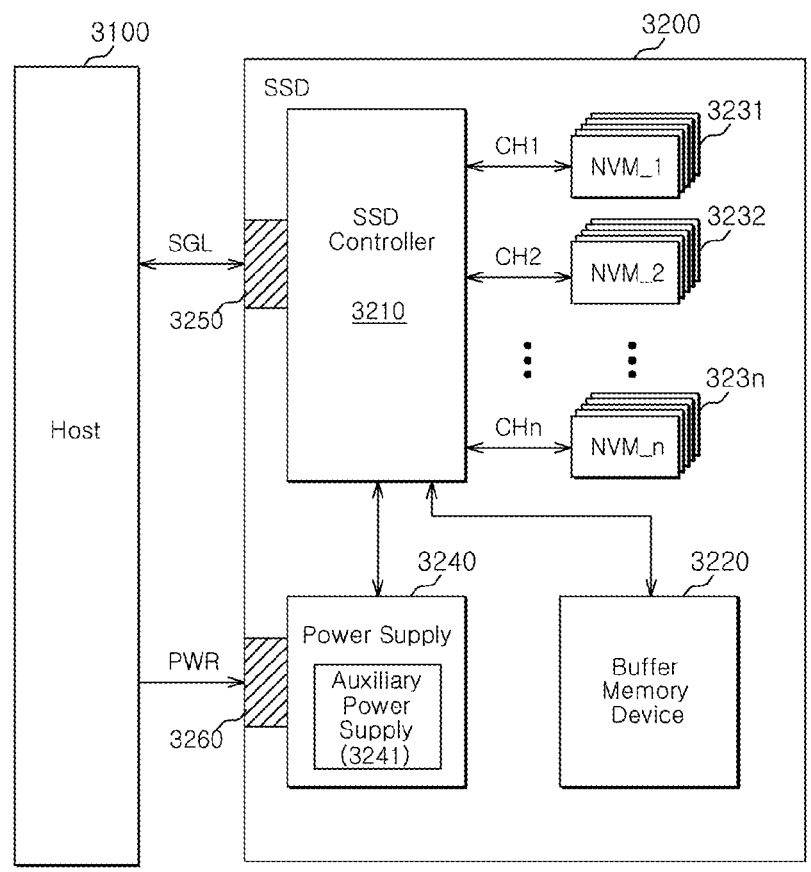
FIG. 9 is a block diagram illustrating an SSD including the multi-chip package memory device according to an embodiment of the present invention.

FIG. 9 is a block diagram illustrating an SSD including the multi-chip package memory device according to an embodiment of the present invention. Referring to FIG. 9, a data processing system 3000 includes a host device 3100 and an SSD 3200.

The SSD 3200 includes an SSD controller 3210, a buffer memory device 3220, a plurality of nonvolatile memory devices 3231 to 323n, a power supply 3240, a signal connector 3250, and a power connector 3260.

The SSD 3200 operates in response to a request from the host device 3100. Particularly, the SSD controller 3210 is configured to access the nonvolatile memory devices 3231 to 323n in response to a request from the host 3100. For example, the SSD controller 3210 is configured to control read, program, and erase operations of the nonvolatile memory devices 3231 to 323n.

The buffer memory device 3220 is configured to temporarily store data which are to be stored in the nonvolatile memory devices 3231 to 323n, and is configured to temporarily store data read from the nonvolatile memory devices 3231 to 323n. The data which are temporarily stored in the buffer memory device 3220 are transmitted to the host device 3100 or the nonvolatile memory devices 3231 to 323n, according to the control of the SSD controller 3210.

The nonvolatile memory devices 3231 to 323n are used as storage media of the SSD 3200. Each of the nonvolatile memory devices 3231 to 323n may include the multi-chip package memory device 500 of FIG. 1 according to an embodiment of the present invention, which may reduce the defect occurrence rate of the SSD 3200.

The respective nonvolatile memory devices 3231 to 323n are connected to the SSD controller 3210 through a plurality of channels CH1 to CHn, respectively. One channel may be connected to one or more nonvolatile memory devices. The nonvolatile memory devices connected to one channel may be connected to the same signal bus and the same data bus.

The power supply 3240 is configured to provide power PWR inputted through the power connector 3260 into the SSD 3200. The power supply 3240 includes an auxiliary power supply 3241, which is configured to supply power to normally terminate the SSD 3200, when sudden power off occurs. The auxiliary power supply 3241 may include super capacitors capable of storing power PWR.

The SSD controller 3210 is configured to exchange signals SGL with the host device 3100 through the signal connector 3250. The signals SGL may include a command, an address, data and the like. The signal connector 3250 may be configured as a connector such as PATA (Parallel Advanced Technology Attachment), SATA (Serial Advanced Technology Attachment), SCSI (Small Computer System Interface), or SAS (Serial SCSI), according to the interface method between the host device 3100 and the SSD 3200.

Figure 10:
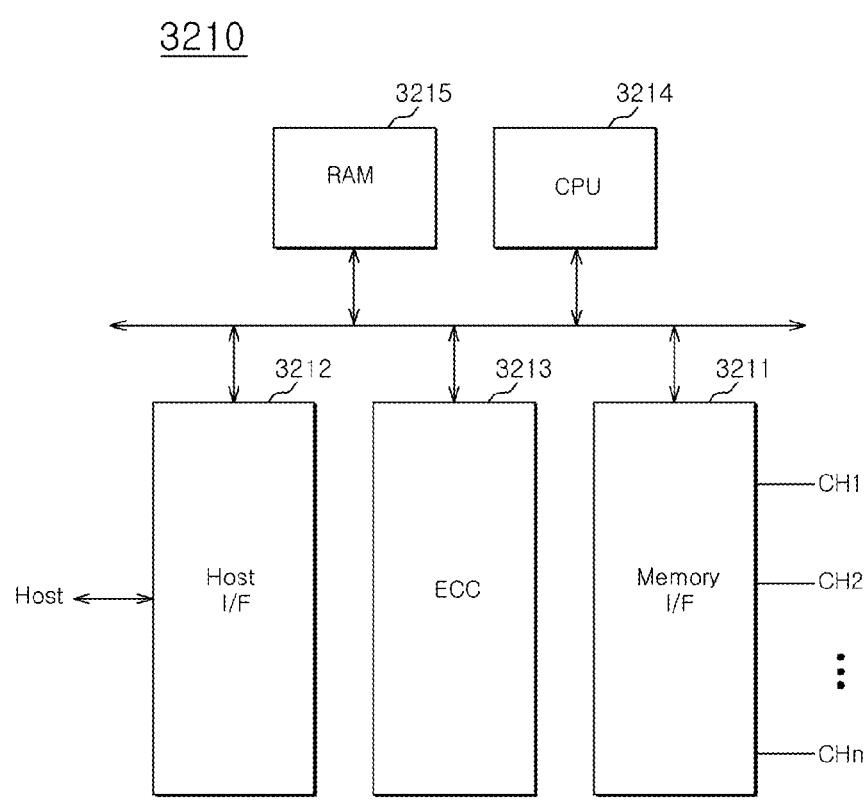
FIG. 10 is a block diagram illustrating the SSD controller illustrated in FIG. 9.

FIG. 10 is a block diagram illustrating the SSD controller illustrated in FIG. 9. Referring to FIG. 9, the SSD controller 3210 includes a memory interface 3211, a host interface 3212, an ECC unit 3213, a CPU 3214, and a RAM 3215.

The memory interface 3211 is configured to provide a command and address to the nonvolatile memory devices 3231 to 323n and to exchange data with the nonvolatile memory devices 3231 to 323n. The memory interface 3211 may scatter data transmitted from the buffer memory device 3220 over the respective channels CH1 to CHn, according to the control of the CPU 3214. The memory interface 3211 transmits data read from the nonvolatile memory devices 3231 to 323n to the buffer memory device 3220, according to the control of the CPU 3214.

The host interface 3212 is configured to provide an interface with the SSD 3200 in response to the protocol of the host device 3100. For example, the host interface 3212 may be configured to communicate with the host 3100 through one of PATA (Parallel Advanced Technology Attachment), SATA (Serial Advanced Technology Attachment), SCSI (Small Computer System Interface), and SAS (Serial SCSI) protocols. The host interface 3212 may perform a disk emulation function of supporting the host device 3100 to recognize the SSD 3200 as a hard disk drive (HDD).

The ECC unit 3213 is configured to generate parity bits based on the data transmitted to the nonvolatile memory devices 3231 to 323n. The generated parity bits may be stored in spare areas of the nonvolatile memory devices 3231 to 323n. The ECC unit 3213 is configured to detect an error of data read from the nonvolatile memory devices 3231 to 323n. When the detected error falls within a correction range, the ECC unit 3213 may correct the detected error.

The CPU 3214 is configured to analyze and process a signal SGL inputted from the host device 3100. The CPU 3214 controls overall operations of the SSD controller 3210 in response to a request from the host device 3100. The CPU 3214 controls the operations of the buffer memory device 3220 and the nonvolatile memory devices 3231 to 323n according to firmware for driving the SSD 3200. The RAM 3215 is used as a working memory device for driving the firmware.

Figure 11:
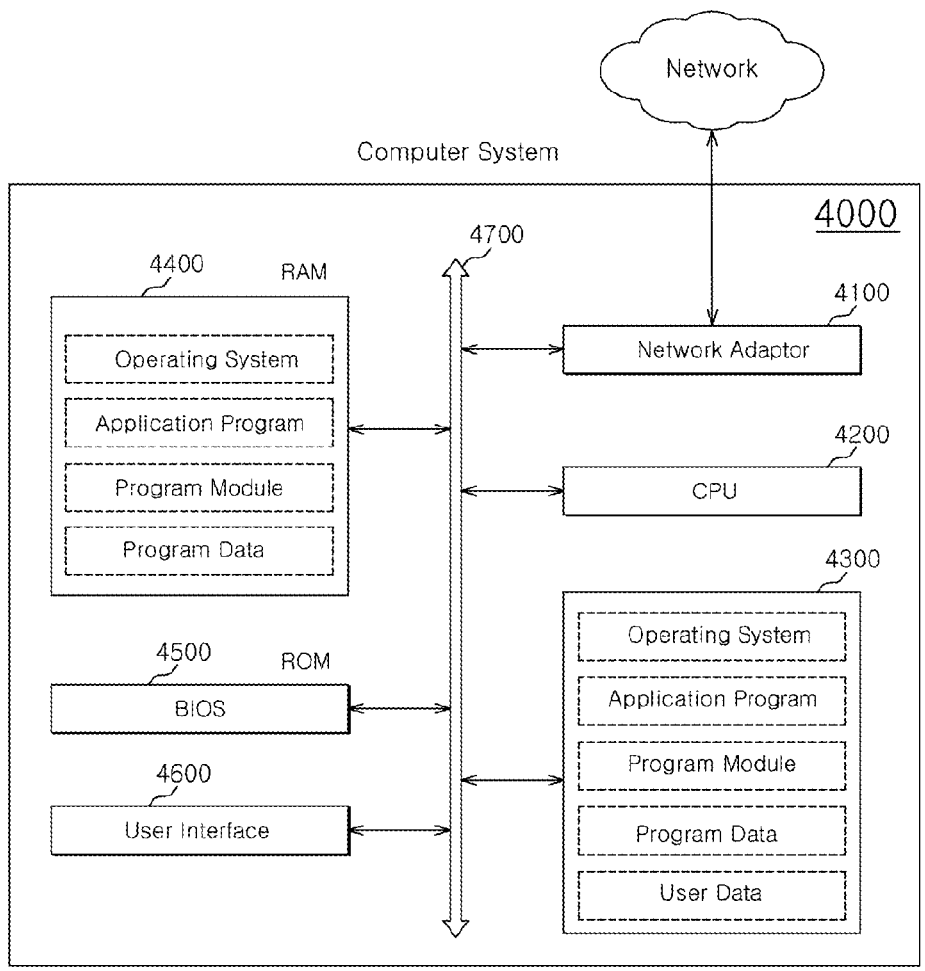
FIG. 11 is a block diagram illustrating a computer system in which the data storage device according to an embodiment of the present invention is mounted.

FIG. 11 is a block diagram illustrating a computer system in which the data storage device according to an embodiment of the present invention is mounted. Referring to FIG. 11, the computer system 4000 includes a network adapter 4100, a CPU 4200, a data storage device 4300, a RAM 4400, a ROM 4500, and a user interface 4600, which are electrically connected to the system bus 4700. The data storage device 4300 may be configured as the data storage device 1200 illustrated in FIG. 6 or the SSD 3200 illustrated in FIG. 9.

The network adapter 4100 is configured to interface the computer system 4000 and external networks. The CPU 4200 is configured to perform overall arithmetic operations for driving an operating system or application programs staying on the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During a booting operation, the operating system, application programs, and various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, an application chipset, a camera image processor (CIS) and the like.

While certain embodiments have been described above, it will be understood to those skilled in the art that the embodiments described are by way of example only. Accordingly, the control method described herein should not be limited based on the described embodiments. Rather, the control method described herein should only be limited in light of the claims that follow when taken in conjunction with the above description and accompanying drawings.

What is claimed is:

1. A control method of a multi-chip package memory device, comprising the steps of:
    setting repaired memory die and normal memory dies among memory dies, based on repair signals applied to the memory dies;
    setting stack states indicating a logical access order of the normal memory dies, based on stack signals applied to the memory dies;
    providing a first control command for storing a first stack information, and an address of a first stack information area in which the first stack information is to be stored, to a failed memory die among the normal memory dies; and storing the first stack information indicating a failure in the first stack information area.

2. The control method according to claim 1, further comprising steps of:

providing a second control command for storing a second stack information, and an address of a second stack information area in which the second stack information is to be stored, to the repaired memory die to replace the failed memory die; and storing the second stack information indicating a stack state of the failed memory die into the second stack information area.

3. The control method according to claim 1, wherein the failed memory die does not operate based on the first stack information.

4. The control method according to claim 1, wherein the repaired memory die operates according to the stack state of the failed memory die, based on the second stack information.

5. The control method according to claim 4, further comprising a step of changing a repair signal applied to the repaired memory die into the same as a repair signal applied to each of the normal memory dies.

6. The control method according to claim 1, wherein the stack signals applied to each of the memory dies are divided into combinations of a power supply voltage level through a ground voltage level.

7. The control method according to claim 1, wherein a repair signal applied to the repaired memory die has a different voltage level from a repair signal applied to each of the normal memory dies.

8. The control method according to claim 1, wherein control signal pads and data pads of each of the memory dies are connected to each other, and wherein the memory dies share control signals and data.

9. The control method according to claim 8, wherein the memory dies are selectively activated by one chip enable signal and addresses different from each other.

10. A control method of a multi-chip package memory device, comprising the steps of:

setting repaired memory die and normal memory dies among memory dies based on repair signals applied to the memory dies, setting stack states indicating a logical access order of normal memory dies based on stack signals applied to the memory dies, controlling a failed memory die among the normal memory dies to cease operation; and providing a second control command for storing a second stack information, and an address of a second stack information area in which the second stack information is to be stored, to the repaired memory die to replace the failed memory die; and storing the second stack information indicating a stack state of the failed memory die into the second stack information area.

11. The control method according to claim 10, wherein the step of controlling a failed memory die comprises the steps of:

providing a first control command for storing a first stack information, and an address of a first stack information area in which the first stack information is to be stored, to the failed memory die; and storing the first stack information indicating a failure in the first stack information area.

12. The control method according to claim 10, wherein the failed memory die does not operate based on the first stack information.

13. The control method according to claim 10, wherein the repaired memory die operates according to the stack state of the failed memory die, based on the second stack information.

14. The control method according to claim 13, further comprising a step of changing a repair signal applied to the repaired memory die into the same as a repair signal applied to each of the normal memory dies.

15. The control method according to claim 10, wherein the stack signals applied to each of the memory dies are divided into combinations of a power supply voltage level through a ground voltage level.

16. The control method according to claim 10, wherein a repair signal applied to the repaired memory die has a different voltage level from a repair signal applied to each of the normal memory dies.

17. The control method according to claim 10, wherein control signal pads and data pads of each of the memory dies are connected to each other, and wherein the memory dies share control signals and data.

18. The control method according to claim 17, wherein the memory dies are selectively activated by one chip enable signal and addresses different from each other.

* * * * *